United States Patent
Nasu et al.

(10) Patent No.: US 6,650,667 B2
(45) Date of Patent: Nov. 18, 2003

(54) SEMICONDUCTOR LASER APPARATUS, SEMICONDUCTOR LASER MODULE, OPTICAL TRANSMITTER AND WAVELENGTH DIVISION MULTIPLEXING COMMUNICATION SYSTEM

(75) Inventors: Hideyuki Nasu, Tokyo (JP); Sumio Sugata, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 89 days.

(21) Appl. No.: 09/858,330

(22) Filed: May 15, 2001

(65) Prior Publication Data

US 2002/0012369 A1 Jan. 31, 2002

(30) Foreign Application Priority Data

May 16, 2000 (JP) ........................................ 2000-144063

(51) Int. Cl.[7] .............................................. H01S 3/131
(52) U.S. Cl. ........................ 372/32; 372/34; 372/29.02; 372/38.02
(58) Field of Search .............................. 372/32, 34, 36, 372/29.02, 38.01, 38.02, 20

(56) References Cited

U.S. PATENT DOCUMENTS 6,212,210 B1 * 4/2001 Serizawa ...................... 372/32
6,298,075 B1 * 10/2001 Kitaoka et al. .......... 372/38.02
6,369,926 B1 * 4/2002 Lyu et al. ...................... 372/32
6,452,953 B1 * 9/2002 Ushirozawa ................. 372/20

* cited by examiner

Primary Examiner—Albert W. Paladini
(74) Attorney, Agent, or Firm—Knobbe Martens Olson & Bear LLP

(57) ABSTRACT

A semiconductor laser apparatus comprises a light-emitting portion including a light-emitting device for outputting a laser beam, a light-receiving element for receiving the laser beam outputted from said light-emitting device, a wavelength monitoring portion including an optical system disposed between said light-emitting device and said light-receiving element, a control portion for controlling the wavelength of the laser beam outputted from said light-emitting device by controlling the temperature of said light-emitting device based on the wavelength of the laser beam detected by said wavelength monitoring portion, an optical isolator disposed on the optical path between said light-emitting device and said wavelength monitoring portion for preventing the light from returning from said wavelength monitoring portion back to said light-emitting device, and a temperature regulating portion for independently controlling the temperatures of said light-emitting portion and wavelength monitoring portion.

18 Claims, 13 Drawing Sheets

SEMICONDUCTOR LASER APPARATUS, SEMICONDUCTOR LASER MODULE, OPTICAL TRANSMITTER AND WAVELENGTH DIVISION MULTIPLEXING COMMUNICATION SYSTEM

BACKGROUND OF THE INVENTION

The present invention relates to a semiconductor laser apparatus, semiconductor laser module, optical transmitter and wavelength division multiplexing communication system, all of which are used in the optical communication system.

In recent years, various new techniques have been developed in the field of semiconductor laser used in the optical communication system. For example, in the wavelength division multiplexing (WDM) communication system, a single-mode laser (e.g., distributed feedback (DFB) laser) has usually been used as a source of signal light. In a dense WDM system (DWDM system), however, a crosstalk between channels may occur to deteriorate signals when the lasing wavelength of the signal light source is out of a predetermined level. To avoid such a problem, a technique of regulating the wavelength of the laser beam launched from a light-emitting device has been developed.

For example, there has been proposed a semiconductor laser apparatus which comprises a light-emitting device for outputting a laser beam and a wavelength monitoring portion for sensing the wavelength of the laser beam outputted from the light-emitting device and which can control the light-emitting device relating to its temperature based on the wavelength of the laser beam sensed by the wavelength monitoring portion so as to control the wavelength of the laser beam launched from the light-emitting device.

SUMMARY OF THE INVENTION

A semiconductor laser apparatus of the present invention comprises a light-emitting portion including a light-emitting device for outputting a laser beam, a light-receiving element for receiving the laser beam outputted from said light-emitting device, a wavelength monitoring portion including an optical system disposed between said light-emitting device and said light-receiving element, a control portion for controlling the wavelength of the laser beam outputted from said light-emitting device by controlling the temperature of said light-emitting device based on the wavelength of the laser beam detected by said wavelength monitoring portion, an optical isolator disposed on the optical path between said light-emitting device and said wavelength monitoring portion for preventing the light from returning from said wavelength monitoring portion back to said light-emitting device, and a temperature regulating portion for independently controlling the temperatures of said light-emitting portion and wavelength monitoring portion.

A semiconductor laser module of the present invention comprises a semiconductor laser apparatus having a light-emitting portion including a light-emitting device for outputting a laser beam, a light-receiving element for receiving the laser beam outputted from said light-emitting device, a wavelength monitoring portion including an optical system disposed between said light-emitting device and said light-receiving element, a control portion for controlling the wavelength of the laser beam outputted from said light-emitting device by controlling the temperature of said light-emitting device based on the wavelength of the laser beam detected by said wavelength monitoring portion, an optical isolator disposed on the optical path between said light-emitting device and said wavelength monitoring portion for preventing the light from returning from said wavelength monitoring portion back to said light-emitting device and a temperature regulating portion for independently controlling the temperatures of said light-emitting portion and wavelength monitoring portion, a package being configured to seal at least the light-emitting portion in said semiconductor laser apparatus in an air-tight manner, and an optical fiber being configured to receive and externally transmitting the laser beam outputted from said semiconductor laser apparatus.

The present invention provides an optical transmitter for transmitting optical signals in a wavelength division multiplexing communication system, comprising a semiconductor laser module having a light-emitting device for outputting a laser beam, a light-receiving element for receiving the laser beam outputted from said light-emitting device, a wavelength monitoring portion including an optical system disposed between said light-emitting device and said light-receiving element, a control portion for controlling the wavelength of the laser beam outputted from said light-emitting device by controlling the temperature of said light-emitting device based on the wavelength of the laser beam detected by said wavelength monitoring portion, an optical isolator disposed on the optical path between said light-emitting device and said wavelength monitoring portion for preventing the light from returning from said wavelength monitoring portion back to said light-emitting device, and a temperature regulating portion for independently controlling the temperatures of said light-emitting portion and wavelength monitoring portion.

The present invention also provides a wavelength division multiplexing communication system having a plurality of optical transmitters for transmitting optical signals, a multiplexer for wavelength multiplexing multi-channel optical signals transmitted from said optical transmitters, a plurality of optical amplifiers connected to one another in a plurality of stages for amplifying and relaying the multiplexed optical signal from said multiplexer, a branching filter for wavelength separating the amplified optical signals from the optical amplifiers for the respective channels and a plurality of optical receivers for receiving the respective optical signals separated by the branching filter, each of said optical transmitters comprising a semiconductor laser module having a light-emitting portion including a light-emitting device for outputting a laser beam, a light-receiving element for receiving the laser beam outputted from said light-emitting device, a wavelength monitoring portion including an optical system disposed between said light-emitting device and said light-receiving element, a control portion for controlling the wavelength of the laser beam outputted from said light-emitting device by controlling the temperature of said light-emitting device based on the wavelength of the laser beam detected by said wavelength monitoring portion, an optical isolator disposed on the optical path between said light-emitting device and said wavelength monitoring portion for preventing the light from returning from said wavelength monitoring portion back to said light-emitting device, and a temperature regulating portion for independently controlling the temperatures of said light-emitting portion and wavelength monitoring portion.

BRIEF DESCRIPTION OF THE DRAWINGS

FIG. 3(A) is a plan cross-sectional view showing a semiconductor laser module constructed according to a third embodiment of the present invention while FIG. 3(B) is a side view thereof showing a PD carrier.

FIG. 11(A) is a plan view schematically showing a semiconductor laser module constructed according to an eighth embodiment of the present invention while FIG. 11(B) is a block diagram showing the layout of a wavelength monitoring portion.

DETAILED DESCRIPTION

Figure 1:
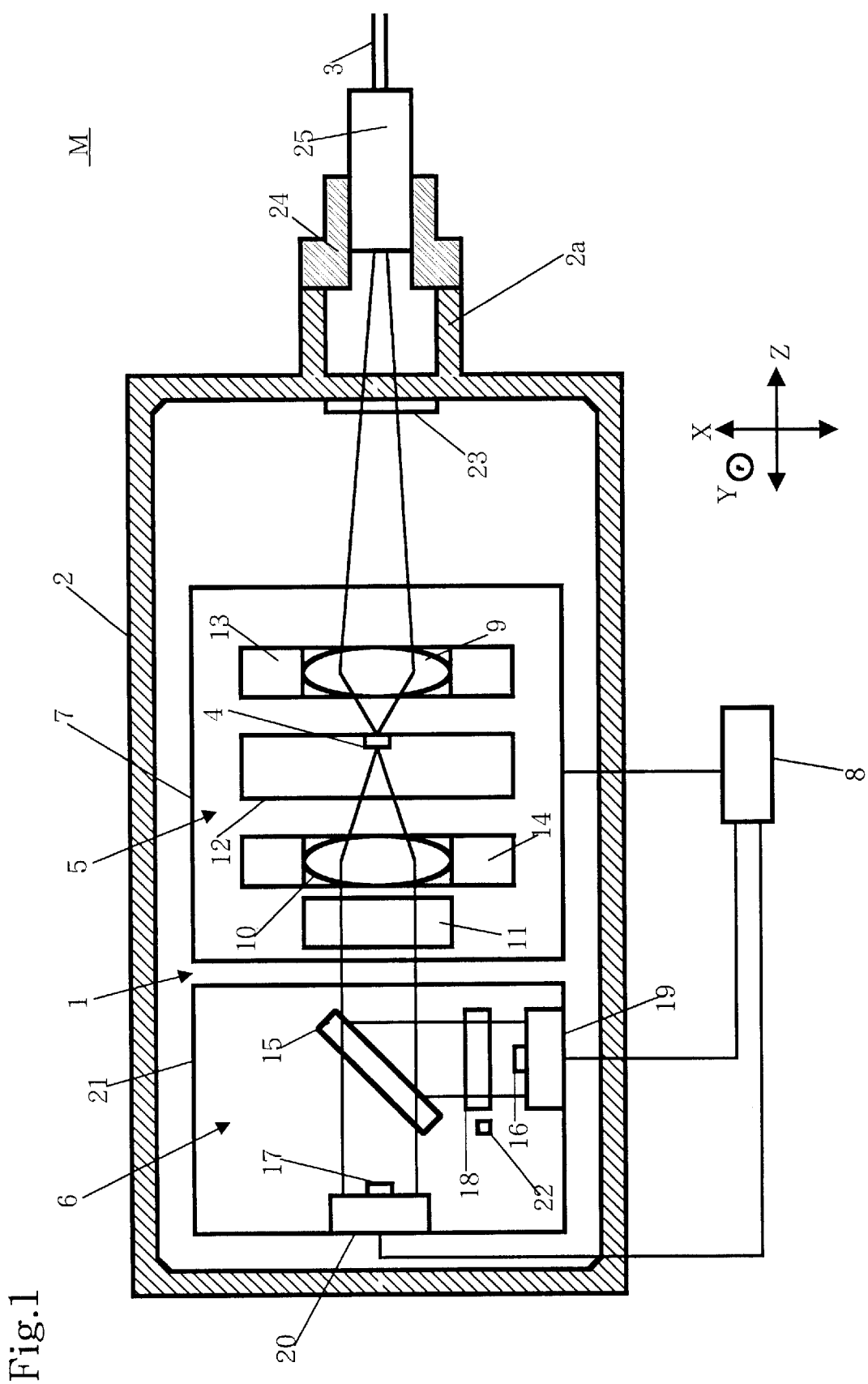
FIG. 1 is a plan cross-sectional view showing a semiconductor laser module constructed according to a first embodiment of the present invention.

Several embodiments of the present invention will now be described with reference to the drawings. FIG. 1 is a plan cross-sectional view showing a semiconductor laser module constructed according to a first embodiment of the present invention.

Referring to FIG. 1, the semiconductor laser module M according to the first embodiment of the present invention comprises a semiconductor laser apparatus 1 for outputting a laser beam, a package 2 air-tightly sealing the semiconductor laser apparatus 1 and an optical fiber 3 which receives the laser beam outputted from the semiconductor laser apparatus 1 and then transmits it externally.

The semiconductor laser apparatus 1 comprises a light-emitting portion 5 including an light-emitting device 4 formed by a semiconductor laser diode for outputting a laser beam (e.g., DFB laser diode device having its lasing wavelength band of 1.55 $\mu$m), a wavelength monitoring portion 6 for sensing the wavelength of the laser beam outputted from the light-emitting device 4, a first temperature regulating portion 7 including a plurality of Peltier devices for controlling the temperature of the light-emitting device 4, and a control portion 8 for controlling the first temperature regulating portion 7 such that the lasing wavelength of the laser beam outputted from the light-emitting device 4 will be controlled to a desired wavelength depending on the output of the wavelength monitoring portion 6.

The light-emitting portion 5 includes a condensing lens 9 for condensing the laser beam outputted from the front emitting end of the light-emitting device 4 (or the right end thereof as viewed in FIG. 1) and a collimating lens 10 for collimating the laser beam outputted from the back emitting end of the light-emitting device 4 (or the left end thereof as viewed in FIG. 1). The light-emitting device 4 is fixedly mounted on an LD carrier 12. The condensing lens 9 is held by a first lens holder 13 while the collimating lens 10 is held by a second lens holder 14.

On the backside of the collimating lens 10 is provided an optical isolator 11 for preventing the light from returning from the wavelength monitoring portion 6 back to the light-emitting device 4. The optical isolator 11 may be any one known in the art which has a combination of light polarizer and Faraday rotator.

Figure 9:
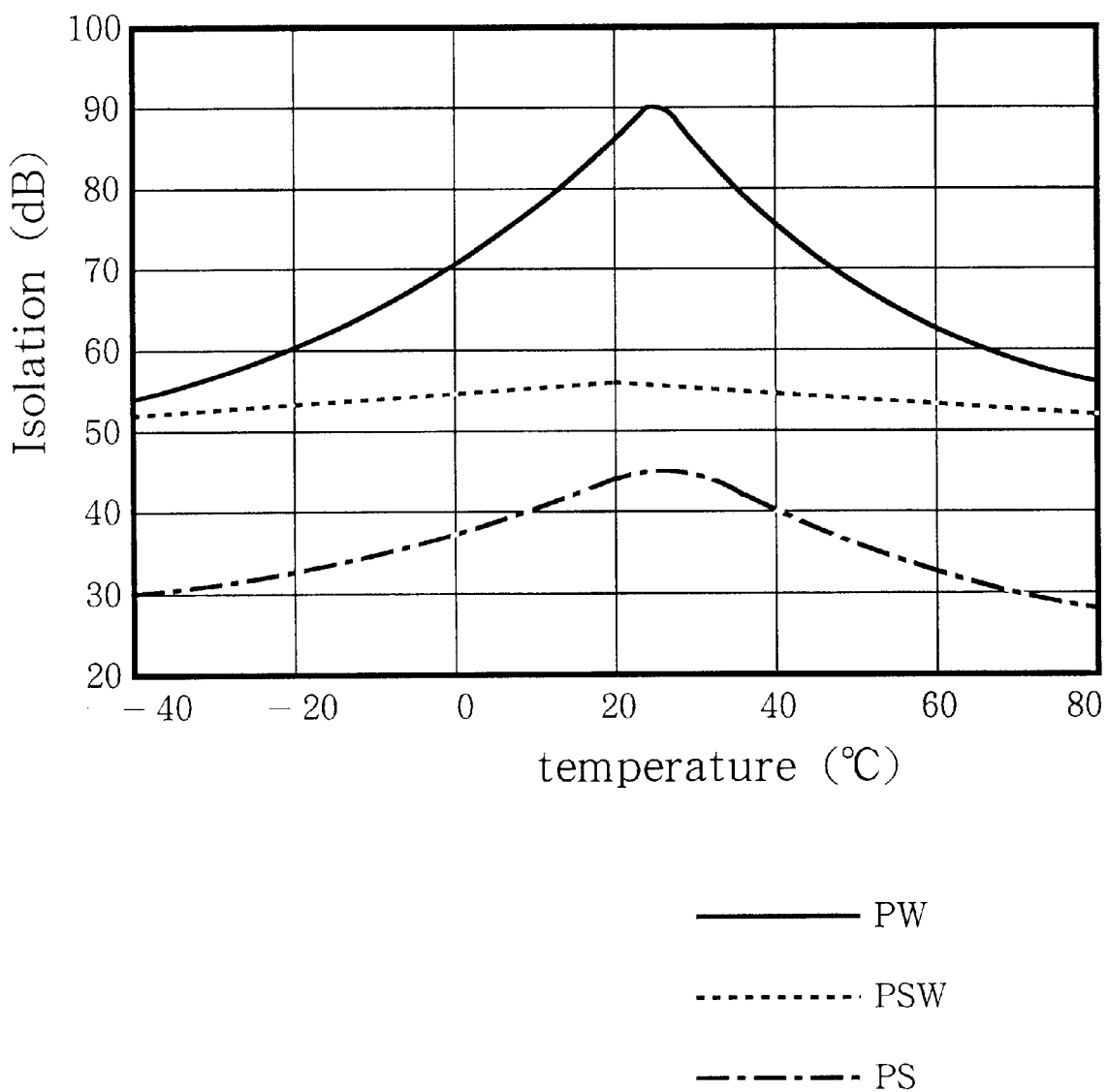
FIG. 9 is a graph illustrating the temperature characteristics of an optical isolator.

The LD carrier 12, first lens holder 13, second lens holder 14 and optical isolator 11 are fixedly mounted on the first temperature regulating portion 7 including the Peltier devices. FIG. 9 shows the temperature characteristics of the optical isolator 11 (or the relationship between the temperature and the isolation). As will be apparent from FIG. 9, the temperature of the optical isolator 11 is controlled by the first temperature regulating portion 7 together with the light-emitting device 4 such that the prevention of returning light will be maximized.

In FIG. 9, line PS represents the results of an optical isolator of such a type that uses one stage consisting of a combination of light polarizer-Faraday rotator-light polarizer. Line PW represents the results of an optical isolator of such a type that two stages of such PS type are connected in series. PSW represents the results of an optical isolator of such a type that used a combination of light polarizer-Faraday rotator-light polarizer-Faraday rotator-light polarizer.

The wavelength monitoring portion 6 comprises a half mirror (or optical branching member) 15 for branching the laser beam outputted from the back end of the light-emitting device 4 and collimated by the collimating lens 10, a first light-receiving element (or photodiode) 16 for receiving one of the laser beams branched by the half mirror 15, a second light-receiving element (or photodiode) 17 for receiving the other of the laser beams branched by the half mirror 15 and an optical filter 18 disposed between the half mirror 15 and the first light-receiving element 16 for varying the wavelength-to-strength characteristics of the laser beam.

The first and second light-receiving elements 16, 17 are fixedly mounted on the first and second PD carriers 19, 20, respectively.

PD currents outputted from the first and second light-receiving elements 16, 17 are inputted into the control portion 8.

Figure 8:
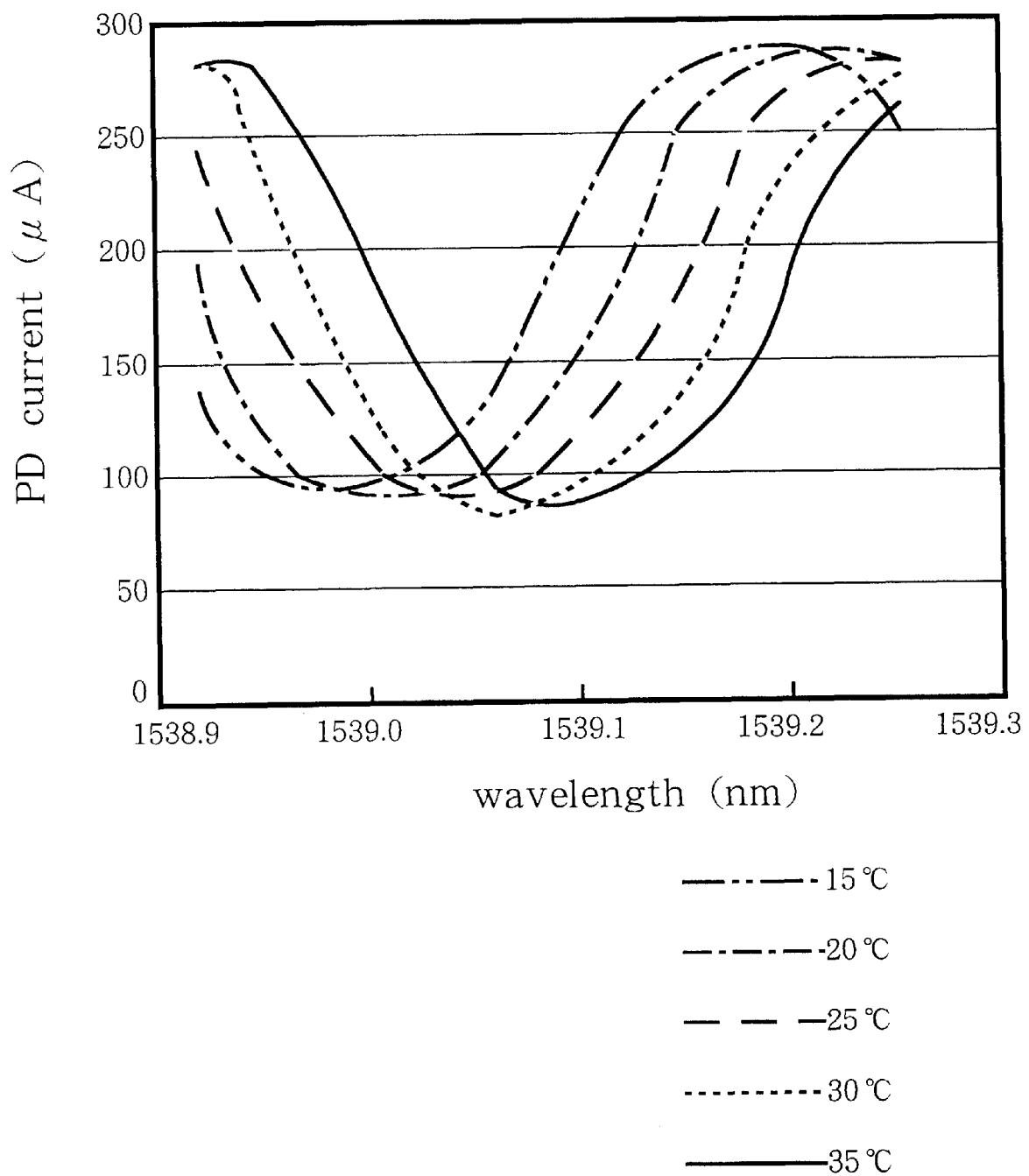
FIG. 8 is a graph illustrating the temperature characteristics of an optical filter.

The optical filter 18 may be formed as by an etalon comprising a silica glass and thin-films formed on the opposite sides thereof. The optical filter 18 has its wavelength characteristics of transmissivity depending on temperature. For example, the temperature characteristics (or the relationships between the wavelength and the PD current at the respective temperatures) of the optical filter 18 if it is formed by crystal are shown in FIG. 8. Thus, the wavelength monitoring portion 6 is located on the second temperature regulating portion 21 consisting of Peltier devices or others and spaced apart from the first temperature regulating portion 7 such that the temperature thereof can be controlled independently of the light-emitting portion 5.

The control portion 8 controls the first temperature regulating portion 7 to control the wavelength of the laser beam outputted from the light-emitting device 4, based on the values of PD current inputted from the first and second light-receiving elements 16, 17.

The wavelength monitoring portion 6 includes a temperature sensor 22 of thermistor or the like for sensing the temperature thereof. Based on the temperature sensed by the temperature sensor 22, the second temperature regulating portion 21 is controlled so that the wavelength monitoring portion 6 reaches the desired temperature.

The side of the package 2 is formed with a window 23 onto which the beam passed through the condensing lens 9 enters. The side of the package 2 also includes a flange portion 2a formed thereon, the end face of which fixedly supports a metal sleeve 24 through YAG laser welding.

The tip end of the optical fiber 3 is held by a ferrule 25 which is in turn fixedly mounted on the interior of the sleeve 24 through YAG laser welding.

The open top of the package 2 is covered with a closure (not shown). The periphery of the closure is laser welded to the package 2 to seal the interior of the package 2 air-tightly.

The laser beam outputted from the front end of the light-emitting device 4 is condensed by the condensing lens 9, the condensed beam entering the optical fiber 3 held by the ferrule 25 through the window 23 and being then transmitted to outside.

On the other hand, the monitoring laser beam outputted from the back end of the light-emitting device 4 is collimated by the collimating lens 10 and then enters the wavelength monitoring portion 6 through the optical isolator 11.

The laser beam entered the wavelength monitoring portion 6 is branched by the half mirror 15 into a beam portion directed to Z-axis direction (or direction of transmission) and another beam portion directed to X-axis direction (or direction of reflection) which is perpendicular to the Z-axis direction. The laser beam portion directed to the Z-axis direction is received by the second light-receiving element 17 while the laser beam portion directed to the X-axis direction is received by the first light-receiving element 16. The PD currents outputted from the first and second light-receiving elements 16, 17 are inputted into the control portion 8 which in turn controls the first temperature regulating portion 7 based on the inputted PD currents such that the wavelength of the laser beam outputted from the light-emitting device 4 is controlled.

The conventional semiconductor laser systems raised a problem in that the returning beams from the fiber end, beam splitter, optical filter in the wavelength monitoring portion are summed to provide an increased beam returned back to the light-emitting device. Particularly, with DFB laser, the single longitudinal mode would be disturbed by the external returning light beam to vary the lasing wavelength and/or to provide an instability such as longitudinal mode hop or the like.

On the contrary, the semiconductor laser module M according to the first embodiment of the present invention will not vary the lasing wavelength of the light-emitting device 4 due to the returning light beam from the wavelength monitoring portion 6 since the optical isolator 11 for preventing the returning beam from the wavelength monitoring portion 6 is disposed between the light-emitting device 4. This can control the lasing wavelength of the light-emitting device 4 more constantly.

Furthermore, the light-emitting portion 5 and wavelength monitoring portion 6 can be controlled optimum since their temperatures are independently controlled. Additionally, the optical isolator 11 prevents the light beam from returned from the wavelength monitoring portion 6 back to the light-emitting device 4. This prevents the degradation of wavelength characteristic such as longitudinal mode jump or the like in the light-emitting device 4. Therefore, the wavelength of the light-emitting device 4 can be controlled more stably. As a result, the reliability in the semiconductor laser module can be improved. And yet, the degradation of noise characteristic in the light beam outputted from the light-emitting device 4 can be avoided since the optical isolator 11 prevents any returning light from the wavelength monitoring portion 6 to the light-emitting device 4.

Figure 2:
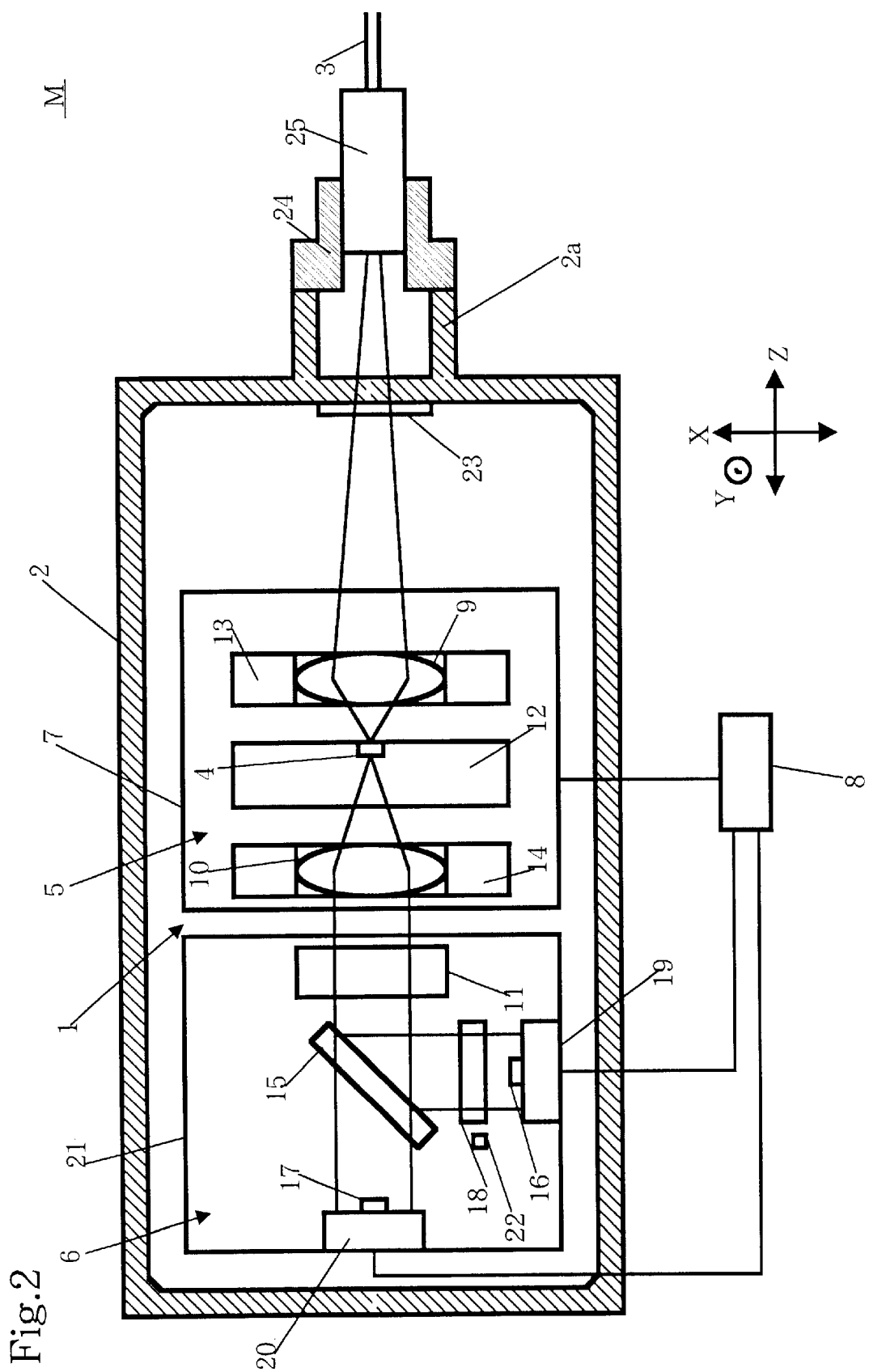
FIG. 2 is a plan cross-sectional view showing a semiconductor laser module constructed according to a second embodiment of the present invention.

FIG. 2 is a plan cross-sectional view showing a semiconductor laser module constructed according to a second embodiment of the present invention.

Referring to FIG. 2, in the second embodiment, the optical isolator 11 is located on the wavelength monitoring portion 6 and disposed in front of the half mirror 15 (on the right side thereof as viewed in FIG. 2). The other structure and advantages are the same as in the first embodiment.

According to the second embodiment of the present invention, the prevention of returning light beam can more be optimized since the light-emitting device 4 and optical isolator 11 are independently controlled in temperature. If the wavelength monitoring portion 6 and optical isolator 11 are mounted on the same second temperature regulating portion 21, the light-emitting portion 5 can be reduced in dimension. Thermal resistance on the first temperature regulating portion 7 which includes the light-emitting device 4 as a source of heat and which must have an increased heat radiation can also be reduced.

Figure 3:
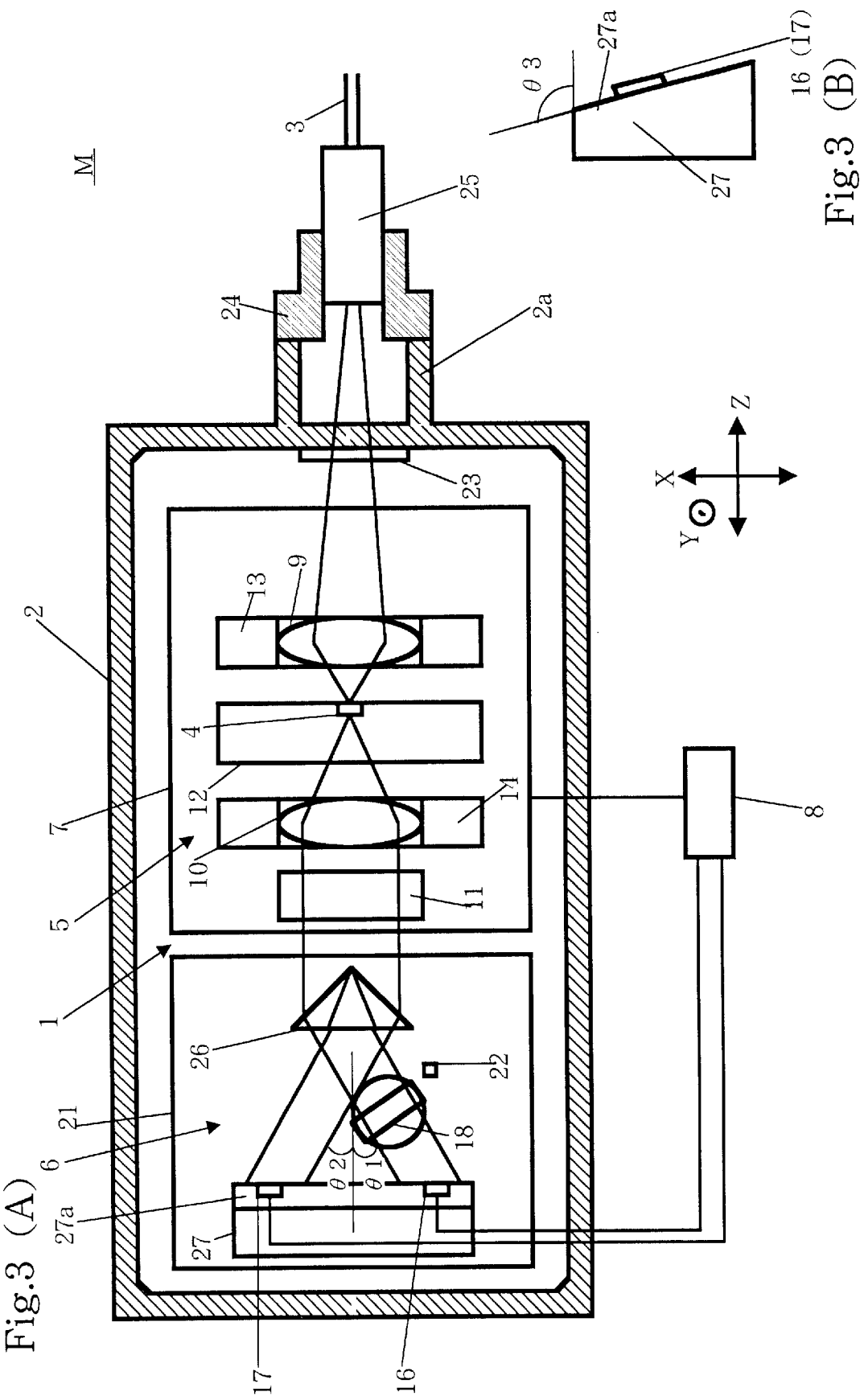

FIG. 3 is a plan cross-sectional view showing a semiconductor laser module constructed according to a third embodiment of the present invention.

Referring to FIG. 3, the wavelength monitoring portion 6 according to the third embodiment comprises a prism (or optical branching member) 25 for branching the laser beam outputted from the light-emitting device 4 into two beam sections respectively inclined relative to the optical axis by given angles $\theta 1$ and $\theta 2$ which are less than 90 degrees, a first light-receiving element 16 for receiving one of the beam sections branched by the prism 26, a second light-receiving element 17 for receiving the other of the beam sections branched by the prism 26, an optical filter 18 disposed between the first light-receiving element 16 and the prism 26 for varying the wavelength-to-strength characteristic of the laser beam, and a PD carrier (or mount member) 27 for mounting the first and second light-receiving elements 16, 17 on the same plane (or the same mount plane herein). The other structure and advantages are the same as in the first embodiment.

The whole prism 26 is coated with AR film for suppressing the reflection of the laser beam. The angles $\theta 1$ and $\theta 2$ of the laser beam sections branched by the prism 26 are preferably substantially equal to each other (e.g., between 15 and 45 degrees). This is because the light receiving positions of the first and second light-receiving elements 16, 17 can more easily be determined.

The mount face 27a of the PD carrier 27 on which the first and second light-receiving elements 16, 17 are mounted is inclined relative to the direction of incident laser beam by an angle $\theta 3$ which exceeds 90 degrees (see FIG. 3(B)). The angle $\theta 3$ of the inclined mount face is preferably equal to or larger than 95 degrees for reducing the reflected returning light beam to provide a good property. If the mount face too largely inclined relative to the direction of incident laser beam, no sufficient PD current capable of being coupled with the light-receiving elements 16, 17 will be provided. It is therefore preferred that the inclined angle θ3 is suppressed at least equal to or smaller than 135 degrees to maintain the degradation of coupling efficiency within 3 dB. It is therefore preferred that the inclined angle θ3 of the mount face 27a is between 95 degrees and 135 degrees.

The laser beam sections from the light-emitting portion 5 branched by the prism 26 about the optical axis are thus inclined with relative to the optical axis by the given angles θ1 and θ2.

One of the laser beam sections branched by the prism 26 enters the optical filter 18 and then is received by the first light-receiving element 16 through the optical filter 18. The other laser beam section is received by the second light-receiving element 17. PD currents outputted from the first and second light-receiving elements 16, 17 are inputted into the control portion 8 which in turn controls the first temperature regulating portion 7 based on the two inputted PD currents such that the wavelength of the laser beam outputted from the light-emitting device 4 will be controlled.

According to the third embodiment of the present invention, the first and second light-receiving elements 16, 17 for receiving the laser beam sections branched by the prism 26 are mounted on the same mount face 27 of the PD carrier 27. This reduces the number of parts and the manufacturing cost.

Since the optical adjustment may only be carried out relating to the one PD carrier 27, the number of manufacturing steps can be reduced to shorten the manufacturing time.

Since the laser beam is branched by the prism 26 into two laser beam sections received by the two light-receiving elements 16, 17 on the one PD carrier 27, the optical path can be reduced to make the module more compact and small. At the same time, the condensing efficiency can be improved for conducting the laser beams into the light-receiving elements 16, 17.

Figure 7:
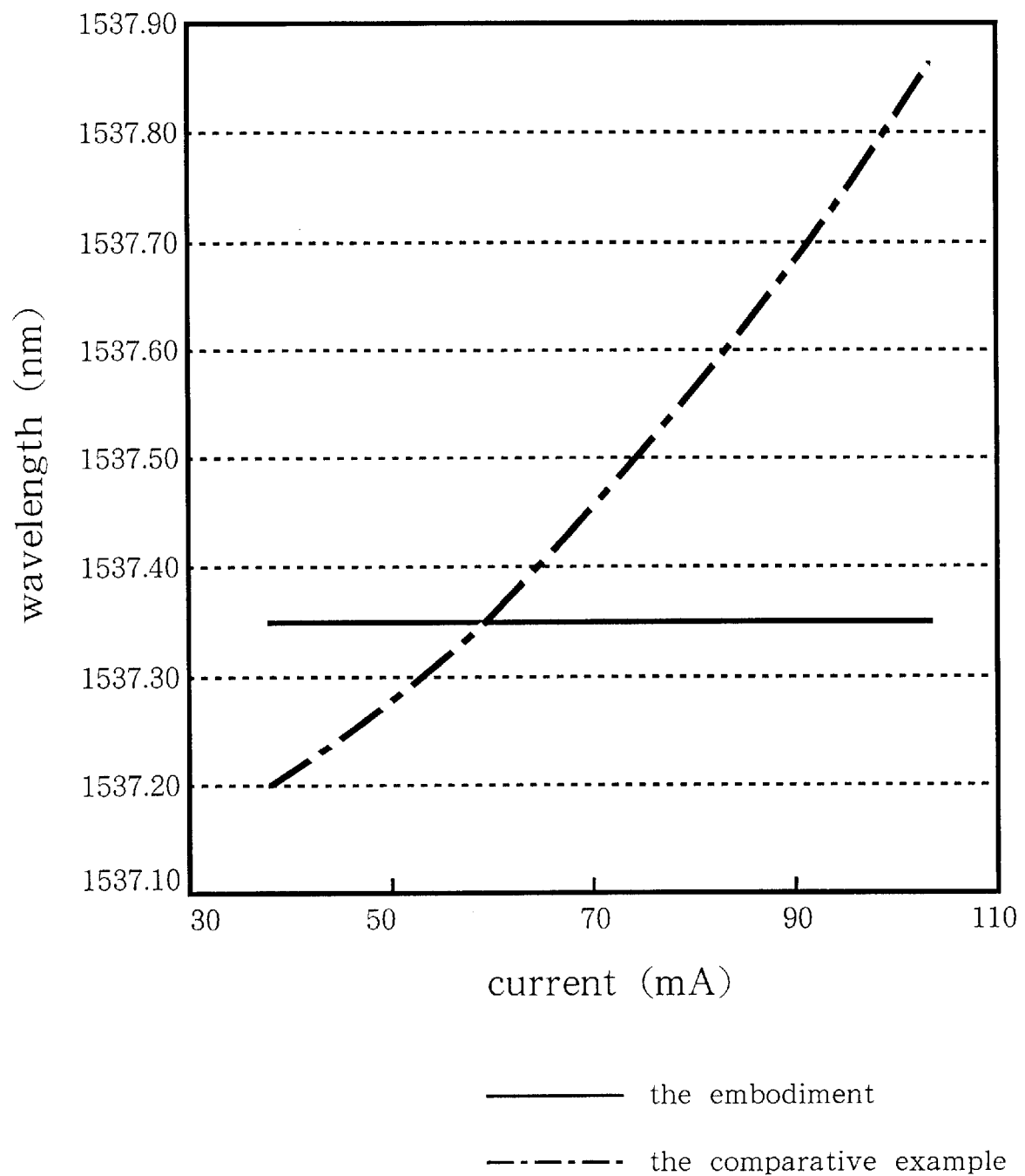
FIG. 7 is a graph illustrating variable wavelength relative to the current injected into a light-emitting device.

FIG. 7 is a graph illustrating variable wavelength relative to the current injected into a light-emitting device. In this graph, solid line represents expected values in the third embodiment of the present invention while one-dot chain line represents actual measurements in a comparative example of ATC (Auto Temperature Control). As will be apparent from FIG. 7, in this embodiment of the present invention, it will be expected that the lasing wavelength of the light-emitting device 4 can more stably be controlled than the comparative example.

Figure 4:
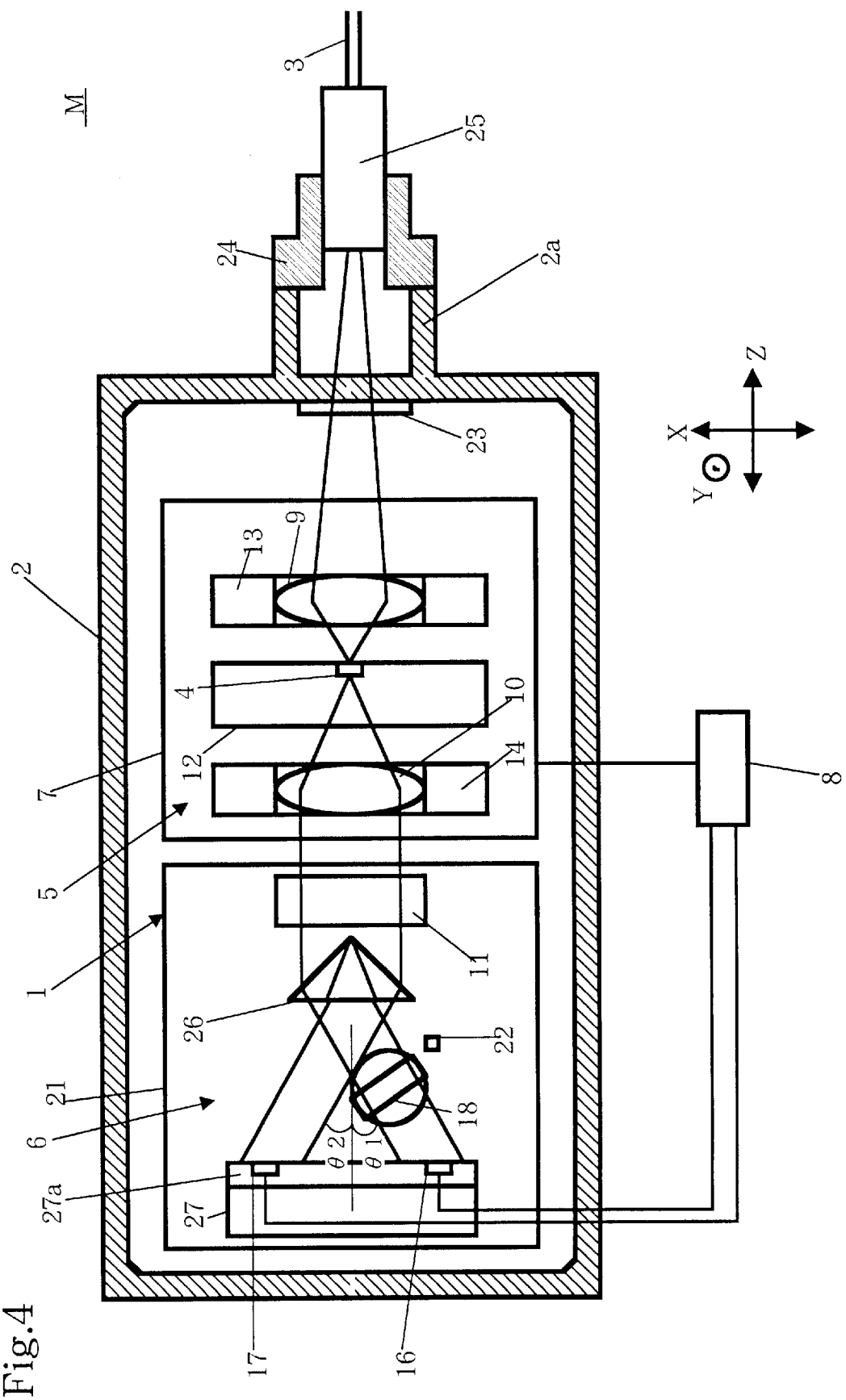
FIG. 4 is a plan cross-sectional view showing a semiconductor laser module constructed according to a fourth embodiment of the present invention.

FIG. 4 is a plan cross-sectional view showing a semiconductor laser module constructed according to a fourth embodiment of the present invention.

Referring to FIG. 4, in the fourth embodiment, the optical isolator 11 is located on the wavelength monitoring portion 6 and disposed in front of the prism 26 (or on the right side thereof as viewed in FIG. 4). The other components and advantages are the same as in the third embodiment.

According to the fourth embodiment, the prevention of returning light beam can more be optimized since the light-emitting device 4 and optical isolator 11 are independently controlled in temperature. If the wavelength monitoring portion 6 and optical isolator 11 are mounted on the same second temperature regulating portion 21, the light-emitting portion 5 can be reduced in dimension. Thermal load on the first temperature regulating portion 7 can also be reduced.

Figure 5:
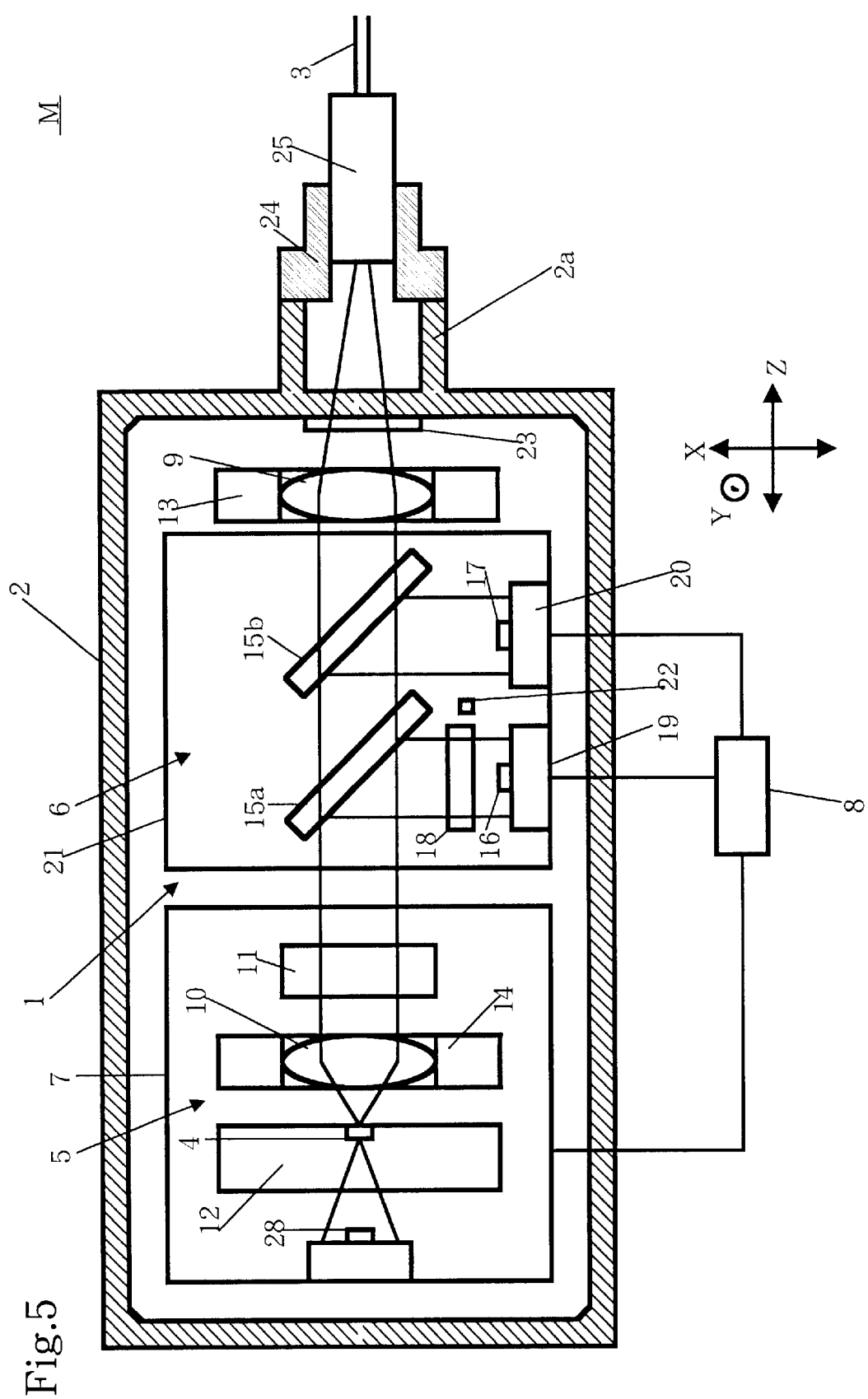
FIG. 5 is a plan cross-sectional view showing a semiconductor laser module constructed according to a fifth embodiment of the present invention.

FIG. 5 is a plan cross-sectional view showing a semiconductor laser module constructed according to a fifth embodiment of the present invention.

Referring to FIG. 5, the fifth embodiment is characterized by that the wavelength monitoring portion 6 is disposed in front of the light-emitting portion 5 (or on the right side thereof as viewed in FIG. 5).

The light-emitting portion 5 comprises a collimating lens 10 for collimating the laser beam outputted from the front (or right as viewed in FIG. 5) emission end of the light-emitting device 4, a photodiode 28 for receiving the laser beam outputted from the back (or left as viewed in FIG. 5) emission end of the light-receiving element 4 and for monitoring the light output thereof, and an optical isolator 11 for preventing any returning light beam from the wavelength monitoring portion 6 back to the light-emitting device 4.

The optical branching member of the wavelength monitoring portion 6 consists of a first half mirror (or optical branching member) 15a and a second half mirror (or optical branching member) 15b. These half mirrors are disposed in series along the Z-axis direction and spaced apart from each other with a given spacing.

The first half mirror 15a divides the laser beam outputted from the light-emitting device 4 into two beam sections, a beam section in the first direction (or X-axis direction) on the side of the first light-receiving element 16 and another beam section in the second direction (or Z-axis direction) on the side of the second half mirror 15b. The second half mirror 15b divides the laser beam from the first half mirror 15a into two further beam sections, that is, a further beam section in the third direction (or X-axis direction) on the side of the second light-receiving element 17 and another further beam section in the fourth direction (or Z-axis direction).

The laser beam sections branched by the second half mirror 15b in the fourth direction (or Z-axis direction) enter the optical fiber 3 held by the ferrule 25 through the condensing lens 9 and window 23 and then are transmitted to outside.

The operations of the light-emitting portion 5 and wavelength monitoring portion 6 in the fifth embodiment are the same as in the first embodiment. Although FIG. 5 shows the first and second light-receiving elements 16, 17 respectively mounted on different PD carriers 19 and 20, they may be mounted on the same mount member.

Figure 6:
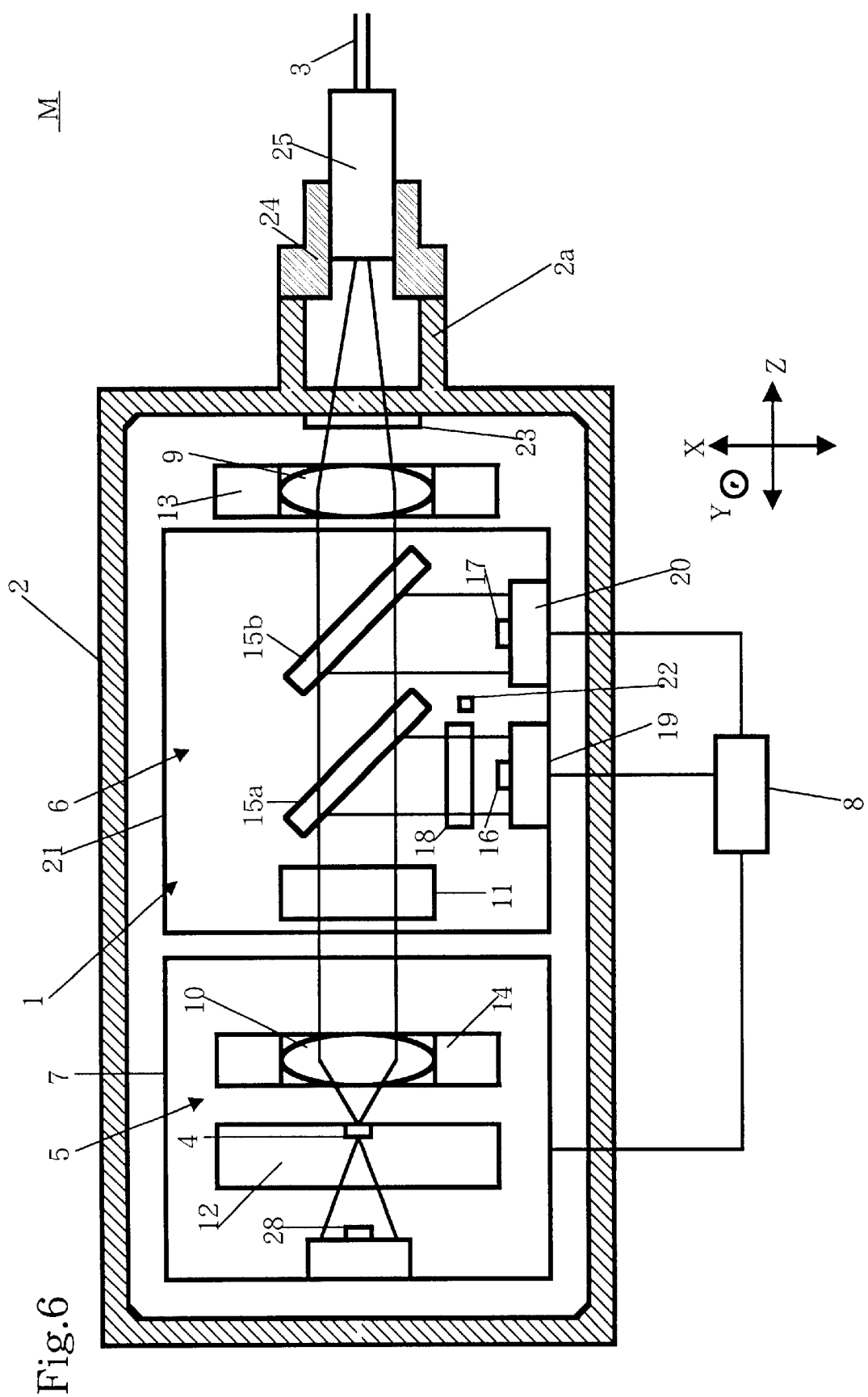
FIG. 6 is a plan cross-sectional view showing a semiconductor laser module constructed according to a sixth embodiment of the present invention.

FIG. 6 is a plan cross-sectional view showing a semiconductor laser module constructed according to a sixth embodiment of the present invention.

Referring to FIG. 6, in the sixth embodiment, the optical isolator 11 is located on the wavelength monitoring portion 6 and disposed in the back side of the first half mirror 15a (on the left side thereof as viewed in FIG. 6). The other structure and advantages are the same as in the first embodiment.

According to the sixth embodiment of the present invention, the prevention of returning light beam can more be optimized since the light-emitting device 4 and optical isolator 11 are independently controlled in temperature. If the wavelength monitoring portion 6 and optical isolator 11 are mounted on the same second temperature regulating portion 21, the light-emitting portion 5 can be reduced in dimension. Thermal load on the first temperature regulating portion 7 can also be reduced.

Figure 10:
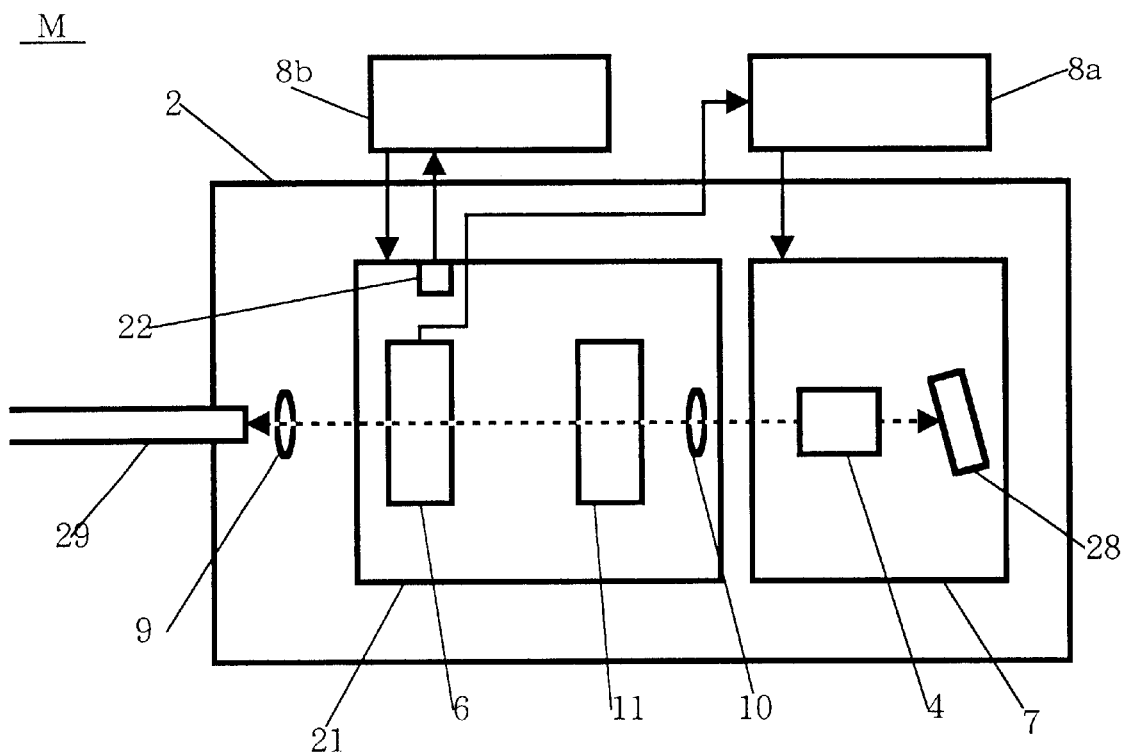
FIGS. 10(A) and (B) are plan and side views schematically showing a semiconductor laser module constructed according to a seventh embodiment of the present invention.
Figure 10:
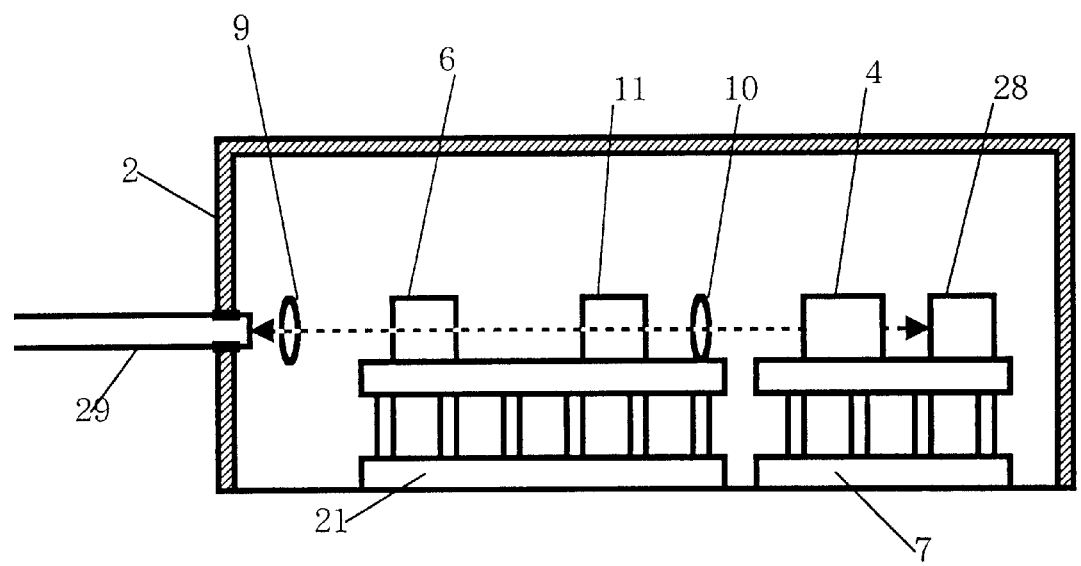

FIGS. 10(A) and (B) are plan and side views schematically showing a semiconductor laser module constructed according to a seventh embodiment of the present invention.

Referring to FIGS. 10(A) and (B), the semiconductor laser module M according to the seventh embodiment of the present invention comprises a light-emitting device 4 for outputting a laser beam, a wavelength monitoring portion 6 for controlling the wavelength of the laser beam outputted from the light-emitting device 4, an optical isolator 11 disposed between the light-emitting device 4 and the wavelength monitoring portion 6 for preventing the returning light beam for the wavelength monitoring portion 6, a package 2 housing the light-emitting device 4, wavelength monitoring portion 6 and optical isolator 11, and a pigtail fiber 29 mounted on the package 2 for externally transmitting the laser beam outputted from the light-emitting device 4.

The light-emitting device 4 is operative to oscillate the laser in its interior (or between the opposite end faces). The lasing wavelength of the light-emitting device 4 depends on its temperature. In order to control the lasing wavelength, the light-emitting device 4 is located on a first temperature regulating portion 7 which may be formed by a temperature controllable Peltier device or the like.

On the backside of the light-emitting device 4 (or on the right side thereof as viewed in FIG. 10) is provided a photodiode 28 for receiving the laser beam from the light-emitting device 4 and for monitoring the light output thereof.

The wavelength monitoring portion 6 is operative to sense the wavelength of the laser beam outputted from the light-emitting device 4. For example, the wavelength monitoring portion 6 may control a first control portion 8a for controlling temperature of the light-emitting device 4 such that the laser beam outputted from the light-emitting device 4 is distributed into two laser beam sections, one of the two beam sections being caused to be inputted into an optical filter as a monitoring light. The transmitted and reflected lights of the optical filter having its transmissivity depending on the wavelength are respectively received by the corresponding photodiodes such that the ratio of the received light outputs becomes constant. The optical filter may be in the form of an etalon which comprises a silica glass and thin-films formed on the opposite sides thereof.

The wavelength monitoring portion 6 may also have its transmissivity depending on the wavelength and be operative to control the first control portion 8a for controlling the temperature of the light-emitting device 4 such that lights reflected from two optical filters having different transmissivities are respectively received by the corresponding photodiodes to make the ratio of the received lights constant.

The optical filter in the wavelength monitoring portion 6 has its transmissivity depending on the temperature thereof. Thus, the wavelength monitoring portion 6 is mounted on a second temperature regulating portion 21 formed by Peltier device or the like, which is located apart from the first temperature regulating portion 7 so that the second temperature regulating portion 21 can control the temperature independently of the light-emitting device 4. The wavelength monitoring portion 6 includes a temperature sensor 22 of thermistor or the like for sensing the temperature thereof. The temperature data sensed by the temperature sensor 22 is inputted into a second control portion 8b which in turn compares the inputted temperature data with a reference temperature data to heat or cool the second temperature regulating portion 21 such that the temperature of the wavelength monitoring portion 6 becomes equal to the reference temperature.

The optical isolator 11 has a loss equal to or higher than about 25 dB relative to the light in the opposite direction. Thus, the light reflected by the wavelength monitoring portion 6, pigtail fiber 26 or the like located upstream of the optical isolator 11 will not substantially return back to the light-emitting device 4. Since such a prevention of returning light in the optical isolator 11 also depends on the temperature, the optical isolator 11 is disposed on the second temperature regulating portion 21 for controlling the temperature.

The pigtail fiber 29 is inserted into an aperture or groove formed in the package 2 in place and suitably secured to the aperture or groove through soldering or the like to maintain the interior of the package 2 air-tightly.

A semiconductor laser module constructed according to the seventh embodiment of the present invention will be described relating to its operation.

The laser beam outputted from the light-emitting device 4 is collimated by a collimating lens 10 and then enters the optical isolator 11. After passed through the optical isolator 11, the laser beam enters the wavelength monitoring portion 6. The wavelength monitoring portion 6 monitors the inputted laser beam to control the first control portion 8a for controlling the temperature of the light-emitting device 4 such that the lasing wavelength can be maintained constant. Thus, the lasing wavelength of the light-emitting device 4 can be stabilized with an improved accuracy.

The laser beam passed through the wavelength monitoring portion 6 is condensed by a condensing lens 9 and then externally transmitted by the pigtail fiber 29.

According to the seventh embodiment of the present invention, the optical isolator 11 for preventing the returning light from the wavelength monitoring portion 6 is disposed between the light-emitting device 4 and the wavelength monitoring portion 6. Therefore, the lasing wavelength of the light-emitting device 4 will not be varied due to the returning light from the wavelength monitoring portion 6. As a result, the lasing wavelength of the light-emitting device 4 can be controlled to be maintained constant.

Since the light-emitting portion 5 and wavelength monitoring portion 6 are controlled in temperature independently of each other, thus, they can be optimized respectively. The optical isolator 11 prevents the light from the wavelength monitoring portion 6 from being returned back to the light-emitting device 4 to avoid the degradation of wavelength characteristics such as longitudinal mode jump and so on in the light-emitting device 4. Thus, the wavelength control of the light-emitting device 4 can more be stabilized. As a result, the reliability of the semiconductor laser module can be improved. And yet, the noise characteristic of the light outputted from the light-emitting device 4 will not be degraded since the optical isolator 11 prevents the returning light from the wavelength monitoring portion 6 back to the light-emitting device 4.

When the wavelength monitoring portion 6 and optical isolator 11 are mounted on the same second temperature regulating portion 21, the module can be reduced in space and the thermal load on the first temperature regulating portion 7 can be relieved.

Figure 11:
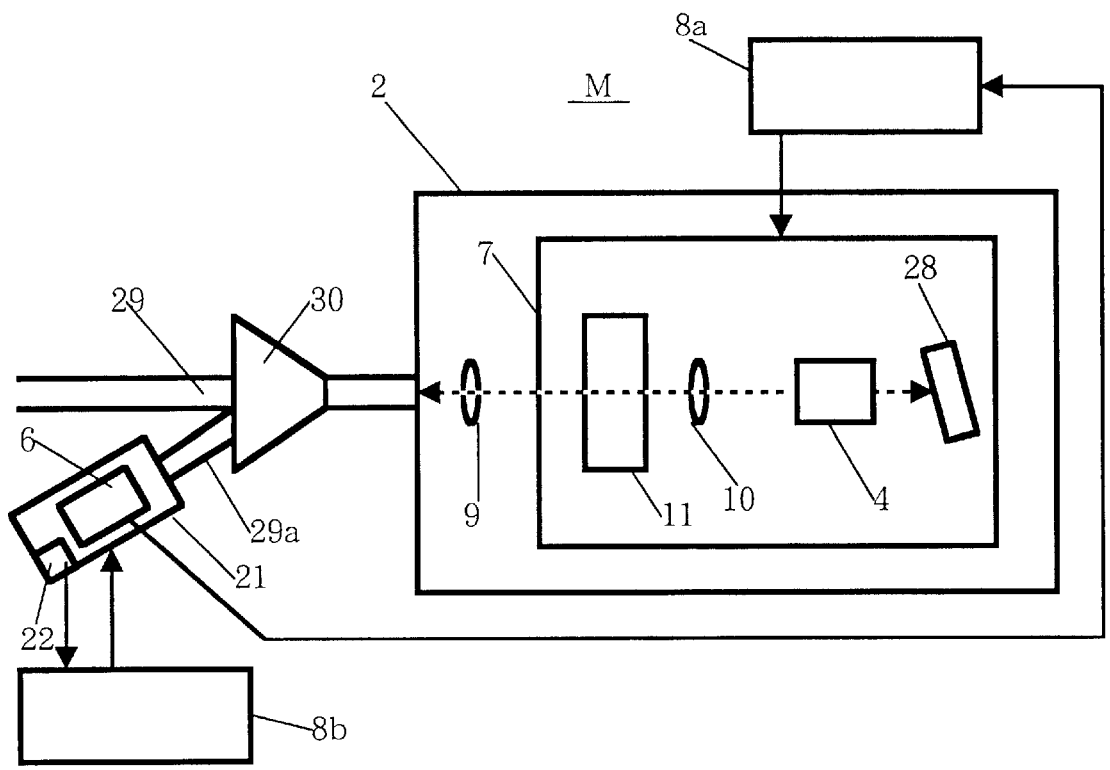
Figure 11:
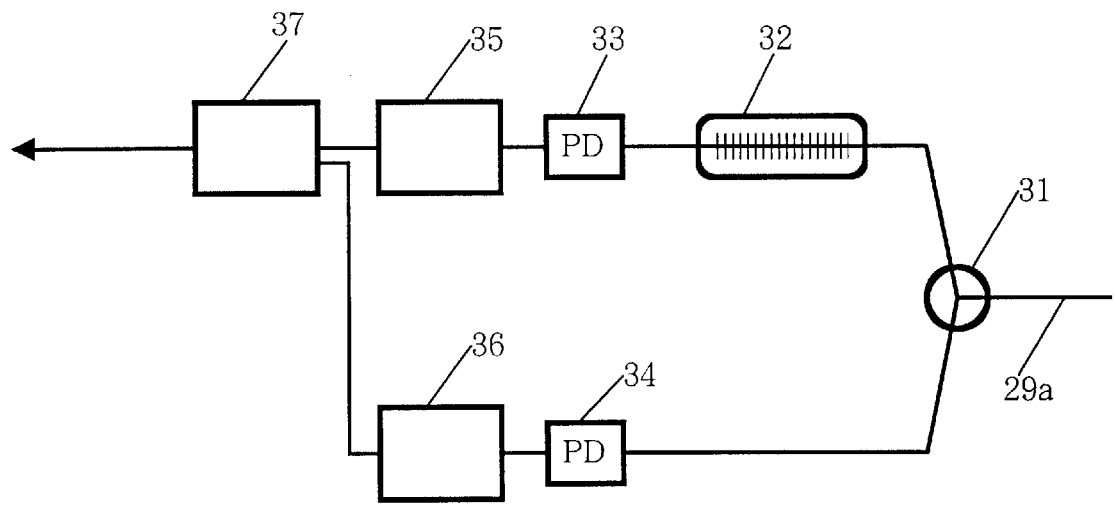

FIG. 11(A) is a plan view schematically showing a semiconductor laser module constructed according to an eighth embodiment of the present invention while FIG. 11(B) is a block diagram showing the layout of a wavelength monitoring portion 6.

Referring to FIG. 11(A), in the eighth embodiment, the light-emitting device 4 and optical isolator 11 are housed within a package 2 while the wavelength monitoring portion 6 is disposed outside of the package 2. The wavelength monitoring portion 6 is connected to one end of a pigtail fiber 29a branched by an optical coupler 30 and configured to control a first control portion 8a for fetching a laser beam from the light-emitting device 4 to control the temperature thereof.

As shown in FIG. 11(B), the wavelength monitoring portion 6 comprises an optical coupler 31 for distributing the laser beam from the pigtail fiber 29a, a fiber Bragg grating (FBG) portion 32 for permitting one of the distributed laser beam sections from the optical coupler 31 to pass therethrough, a first photodiode 33 for receiving one of the laser beam sections passed through the FBG portion 32, a second photodiode 34 for receiving the other of the laser beam sections distributed by the optical coupler 31, a first transformer 35 for transforming the output of the first photodiode 33 into a voltage signal, a second transformer 36 for transforming the output of the second photodiode into a voltage signal, and a differential amplifier 37 for amplifying the output voltages of the first and second transformers 35, 36 and detecting the difference therebetween.

The FBG portion 32 is formed by grating the core of an optical fiber with a fixed pitch. The output voltage signal of the differential amplifier 37 is used as a control signal for controlling the first control portion 8a. The lasing wavelength of the laser beam outputted from the light-emitting device 4 will be controlled such that the above output voltage signal becomes equal to a predetermined voltage level.

According to the eighth embodiment, the package 2 can be reduced in size since the wavelength monitoring portion 6 is disposed outside of the package 2.

Figure 12:
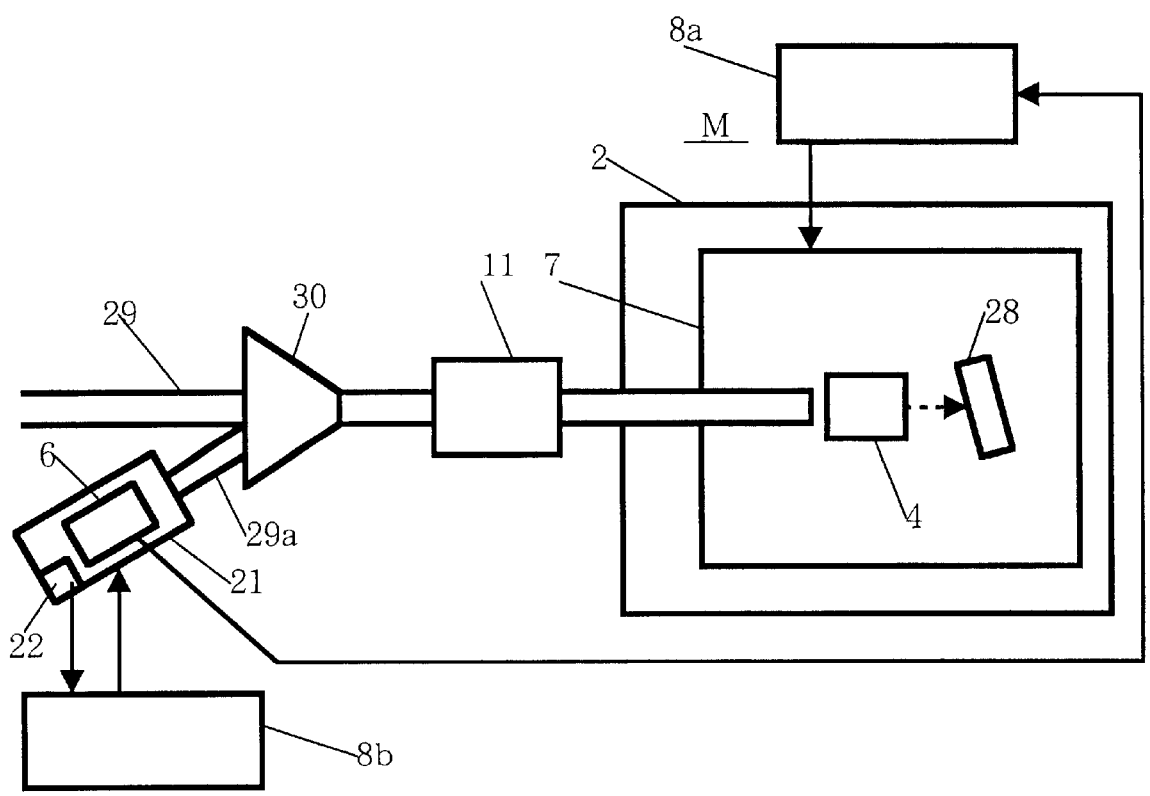
FIG. 12 is a plan cross-sectional view showing a semiconductor laser module constructed according to a ninth embodiment of the present invention.

FIG. 12 is a plan cross-sectional view showing a semiconductor laser module constructed according to a ninth embodiment of the present invention.

Referring to FIG. 12, in the ninth embodiment, a light-emitting device 4 is housed within a package 2 while a wavelength monitoring portion 6 and optical isolator 11 are disposed outside of the package 2.

The wavelength monitoring portion 6 is connected to one end of a pigtail fiber 29a branched by an optical coupler 30 and configured to fetch a laser beam from the light-emitting device 4 for controlling the wavelength of the laser beam outputted from the light-emitting device 4. The optical isolator 11 is disposed between the light-emitting device 4 and an optical coupler 30.

In order to improve the coupling efficiency with the laser beam outputted from the light-emitting device 4, the tip end of the pigtail fiber 29 nearer the light-emitting device 4 is formed into a lens. The tip end of the pigtail fiber 29 is further coated with AR film for suppressing the reflection of laser beam from the end face of the fiber. Thus, the ninth embodiment does not require any lens within the package 2, unlike the seventh and eighth embodiments.

According to the ninth embodiment, the package 2 can further be reduced in size since the wavelength monitoring portion 6 and optical isolator 11 are disposed outside of the package 2.

Figure 13:
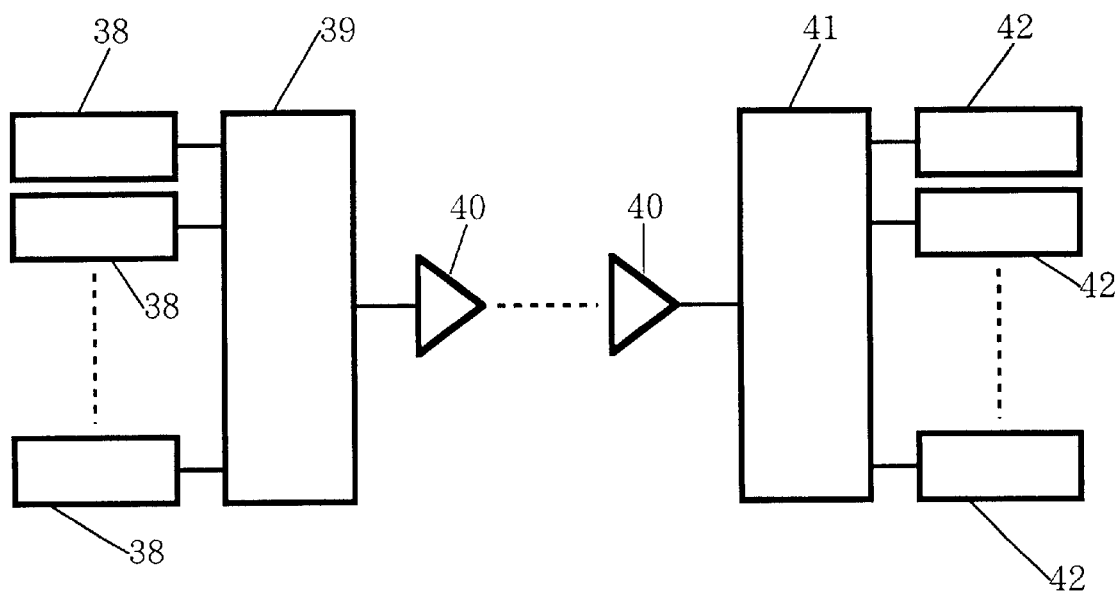
FIG. 13 is a view showing an optical transmitter which is used in a wavelength division multiplexing communication system constructed according to a tenth embodiment of the present invention.

FIG. 13 is a view showing an optical transmitter which is used in a wavelength division multiplexing communication system constructed according to a tenth embodiment of the present invention.

Referring to FIG. 13, the wavelength division multiplexing communication system comprises a plurality of optical transmitters 38 for transmitting optical signals, a multiplexer 39 for wavelength multiplexing multi-channel optical signals transmitted from the optical transmitters 38, a plurality of optical amplifiers 40 connected to one another in a plurality of stages for amplifying and relaying the multiplexed optical signals from the multiplexer 39, a branching filter 41 for wavelength separating the amplified optical signals from the optical amplifiers 40 for the respective channels, and a plurality of optical receivers 42 for receiving the respective optical signals separated by the branching filter 41.

Each of the optical transmitters 38 in the tenth embodiment of the present invention has a semiconductor laser module M which is constructed according to any one of the first to ninth embodiments. Thus, the optical signals transmitted from the optical transmitters 38 can be stabilized in wavelength. This enables a dense WDM system to be constructed with an improved reliability.

The present invention is not limited to the aforementioned embodiments, but may be modified and changed into various forms without departing from the scope of the invention as claimed in the appending claims.

Although the embodiments have been described as to the change of wavelength-to-strength characteristic relating to the light entering only one of the two photodiodes, it may be taken that the wavelength-to-strength characteristics relating to the lights entering both the photodiodes will be changed to differ from each other.

What is claimed is:

1. A semiconductor laser apparatus comprising:
   a light-emitting portion including a light-emitting device for outputting a laser beam;
   a light-receiving element for receiving the laser beam outputted from said light-emitting device;
   a first temperature regulating portion coupled to said light-emitting portion;
   a wavelength monitoring portion comprising an optical system disposed between said light-emitting device and said light-receiving element;
   a second temperature regulating portion separated from said first temperature regulating portion and coupled to said wavelength monitoring portion, such that the temperature of said wavelength monitoring portion is controlled independently of said light-emitting portion;
   a control portion for controlling the wavelength of the laser beam outputted from said light-emitting device by controlling said first temperature regulating portion based on the wavelength of the laser beam detected by said wavelength monitoring portion; and
   an optical isolator disposed on the optical path between said light-emitting device and said wavelength monitoring portion for preventing the light from returning from said wavelength monitoring portion back to said light-emitting device.

2. The semiconductor laser apparatus as defined in claim 1 wherein said optical isolator is coupled to said first temperature regulating portion.

3. The semiconductor laser apparatus as defined in claim 1 wherein said optical isolator is coupled to said second temperature regulating portion.

4. The semiconductor laser apparatus as defined in claim 1, further comprising a collimating lens disposed between said light-emitting device and said optical isolator for collimating the laser beam outputted from said light-emitting device.

5. The semiconductor laser apparatus as defined in claim 1 wherein said first and second temperature regulating portions comprise a Peltier device.

6. The semiconductor laser apparatus as defined in claim 1 wherein said wavelength monitoring portion comprises an optical branching member for branching the laser beam outputted from said light-emitting device into two directions, first and second light-receiving elements for respectively receiving the two laser beam sections branched by said optical branching member and an optical filter disposed between the first and/or second light-receiving elements and said optical branching member for changing the wavelength-to-strength characteristic of the laser beam.

7. The semiconductor laser apparatus as defined in claim 6 wherein said optical branching member consists of a first optical branching member and a second optical branching member and wherein said first optical branching member is configured to branch the laser beam outputted from said light-emitting device into a first direction on the side of said first light-receiving element and a second direction on the side of said second optical branching member, and said second optical branching member is configured to the laser beam from said first optical branching member into a third direction on the side of said second light-receiving element and a fourth direction on the side of light output.

8. The semiconductor laser apparatus as defined in claim 6 wherein the laser beam outputted from said light-emitting device is branched into two directions inclined relative to the optical axis by a predetermined angle smaller than 90 degrees.

9. The semiconductor laser apparatus as defined in claim 6 wherein said first and second light-receiving elements are mounted on the same mount member.

10. The semiconductor laser apparatus as defined in claim 6 wherein said optical branching member is a prism.

11. The semiconductor laser apparatus as defined in claim 6 wherein said optical branching member is a half mirror.

12. The semiconductor laser apparatus as defined in claim 6 wherein said optical filter is an etalon.

13. The semiconductor laser apparatus as defined in claim 6 wherein said optical filter is FBG.

14. A semiconductor laser module comprising:
   a semiconductor laser apparatus having a light-emitting portion including a light-emitting device for outputting a laser beam, a light-receiving element for receiving the laser beam outputted from said light-emitting device, a first temperature regulating portion coupled to said light-emitting portion, a wavelength monitoring portion comprising an optical system disposed between said light-emitting device and said light-receiving element, a second temperature regulating portion separated from said first temperature regulating portion and coupled to said wavelength monitoring portion, such that the temperature of said wavelength monitoring portion is controlled independently of said light-emitting portion, a control portion for controlling the wavelength of the laser beam outputted from said light-emitting device by controlling said first temperature regulating portion based on the wavelength of the laser beam detected by said wavelength monitoring portion and an optical isolator disposed on the optical path between said light-emitting device and said wavelength monitoring portion for preventing the light from returning from said wavelength monitoring portion back to said light-emitting device;
   a package configured to enclose at least said light-emitting portion and said first temperature regulating portion in said semiconductor laser apparatus; and
   an optical fiber mounted to said package and configured to receive and transmitting the laser beam outputted from said light-emitting device to the outside of said package.

15. The semiconductor laser module as defined in claim 14 wherein said light-emitting portion is disposed between said wavelength monitoring portion and said optical fiber such that a laser beam outputted from one of the opposite end faces of the light-emitting device in said light-emitting portion enters said optical fiber while another laser beam outputted from the other end face of said light-emitting device enters said wavelength monitoring portion.

16. The semiconductor laser module as defined in claim 14 wherein said wavelength monitoring portion is disposed between said light-emitting portion and said optical fiber such that a laser beam outputted from one of the opposite end faces of the light-emitting device in said light-emitting portion passes through said wavelength monitoring portion and then enters said optical fiber.

17. An optical transmitter for transmitting optical signals in a wavelength division multiplexing communication system, comprising a semiconductor laser module having a light-emitting device for outputting a laser beam, a light-receiving element for receiving the laser beam outputted from said light-emitting device, a first temperature regulating portion coupled to said light-emitting portion, a wavelength monitoring portion comprising an optical system disposed between said light-emitting device and said light-receiving element, a second temperature regulating portion separated from said first temperature regulating portion and coupled to said wavelength monitoring portion, such that the temperature of said wavelength monitoring portion is controlled independently of said light-emitting portion, a control portion for controlling the wavelength of the laser beam outputted from said light-emitting device by controlling said first temperature regulating portion based on the wavelength of the laser beam detected by said wavelength monitoring portion and an optical isolator disposed on the optical path between said light-emitting device and said wavelength monitoring portion for preventing the light from returning from said wavelength monitoring portion back to said light-emitting device.

18. A wavelength division multiplexing communication system comprising a plurality of optical transmitters for transmitting optical signals, a multiplexer for wavelength multiplexing multi-channel optical signals transmitted from said optical transmitters, a plurality of optical amplifiers connected to one another in a plurality of stages for amplifying and relaying the multiplexed optical signal from said multiplexer, a branching filter for wavelength separating the amplified optical signals from the optical amplifiers for the respective channels and a plurality of optical receivers for receiving the respective optical signals separated by the branching filter, each of said optical transmitters comprising a semiconductor laser module having a light-emitting portion including a light-emitting device for outputting a laser beam, a light-receiving element for receiving the laser beam outputted from said light-emitting device, a first temperature regulating portion for controlling the temperature of said light-emitting portion, a wavelength monitoring portion comprising an optical system disposed between said light-emitting device and said light-receiving element, a second temperature regulating portion for controlling the temperature of said wavelength monitoring portion, said second temperature regulating portion being separated from said first temperature regulating portion such that the temperature of said wavelength monitoring portion is controlled independently of said light-emitting portion, a control portion for controlling the wavelength of the laser beam outputted from said light-emitting device by controlling said first temperature regulating portion based on the wavelength of the laser beam detected by said wavelength monitoring portion and an optical isolator disposed on the optical path between said light-emitting device and said wavelength monitoring portion for preventing the light from returning from said wavelength monitoring portion back to said light-emitting device.

* * * * *